(12) United States Patent
Ikehashi (10) Patent No.: US 7,940,514 B2
(45) Date of Patent: May 10, 2011

(54) MEMS DEVICE USING AN ACTUATOR

(75) Inventor: Tamio Ikehashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 659 days.

(21) Appl. No.: 11/746,813

(22) Filed: May 10, 2007

(65) Prior Publication Data

US 2007/0262400 A1 Nov. 15, 2007

(30) Foreign Application Priority Data

May 12, 2006 (JP) ................................. 2006-134011

(51) Int. Cl.
*H01G 5/00* (2006.01)
*H01G 7/00* (2006.01)

(52) U.S. Cl. ....................................... 361/277; 361/278

(58) Field of Classification Search .................. 361/277, 361/278
See application file for complete search history.

(56) References Cited

U.S. PATENT DOCUMENTS

| | | | | |
|---|---|---|---|---|
| 6,236,005 | B1 * | 5/2001 | Kvisteroey et al. | 200/61.45 R |
| 2001/0002872 | A1 * | 6/2001 | Dhuler | 361/277 |
| 2005/0242687 | A1 * | 11/2005 | Kawakubo et al. | 310/324 |
| 2006/0171097 | A1 * | 8/2006 | Shimanouchi et al. | 361/277 |
| 2006/0215348 | A1 * | 9/2006 | Won et al. | 361/277 |

FOREIGN PATENT DOCUMENTS

JP 2001-250997 9/2001

OTHER PUBLICATIONS

Kevin F. Harsh, et al., "The realization and design considerations of a flip-chip integrated MEMS tunable capacitor," Sensors and Actuators 80 (2000), pp. 108-118.

Dimitrios Peroulis, et al., "Electromechanical Considerations in Developing Low-Voltage RF MEMS Switches," IEEE Transactions on Microwave Theory and Techniques, vol. 51, No. 1, Jan. 2003, pp. 259-270.

* cited by examiner

*Primary Examiner* — Eric Thomas
(74) *Attorney, Agent, or Firm* — Oblon, Spivak, McClelland, Maier & Neustadt, L.L.P.

(57) ABSTRACT

A micro-electro-mechanical system (MEMS) includes a first electrode interposed between a first fixed end and a second fixed end, the first electrode being movable by an actuator element. The MEMS also includes a substrate on which the first and second fixed ends are located. The MEMS further includes a second electrode formed on the substrate to face the first electrode. A shape from the first electrode to the first fixed end and a shape from the first electrode to the second fixed end are asymmetrical, the first electrode to be lowered to the second electrode.

19 Claims, 12 Drawing Sheets

MEMS DEVICE USING AN ACTUATOR

CROSS-REFERENCE TO RELATED APPLICATIONS

This application is based upon and claims the benefit of priority from prior Japanese Patent Application No. 2006-134011, filed May 12, 2006, the entire contents of which are incorporated herein by reference.

BACKGROUND OF THE INVENTION

1. Field of the Invention

The present invention relates to a micro machine or MEMS (Micro-Electro-Mechanical Systems) device using an actuator. For example, the present invention relates to a MEMS device using a piezoelectric type or electrostatic type actuator.

2. Description of the Related Art

The following bridge structure is preferably used in order to reduce a warp resulting from residual stress when switch and variable capacitor are formed using a MEMS device using a piezoelectric type actuator. According to the bridge structure, both ends of a beam (elastic member) where an electrode is arranged are supported by two fixed ends. In the variable capacitor having the bridge structure, if tensile residual stress exists in the beam, there is a problem that piezoelectric displacement decreases. In order to solve the foregoing problem, it is effective to employ a spring structure (flexure structure) as part of the beam.

However, the following problem arises as seen from the description of the following document 1 if the spring structure is symmetrically given on both sides of the electrode of the variable capacitor. Specifically, a restoring force of the electrode becomes weak from a state that electrodes contact each other. As a result, a failure resulting from stiction is easy to occur.

Document 1: K. F. Harsh et al., "The realization and design considerations of a flip-flop integrated MEMS tunable capacitor", Sensors and Actuators 80 (2000) 108-118.

Even if the spring structure is employed, a fixed electrode may be further provided above the electrode to sufficiently secure the restoring force as seen from the description of the following document 2.

Document 2: D. Peroulis et al., "Electromechanical Considerations in Developing Low-Voltage RF MEMS Switches", IEEE TRANSACTIONS ON MICROWAVE THEORY AND TECHNIQUES, VOL 51, No. 1, January 2003.

However, according to the structure that is described in document 2, a cavity must be formed double, and in addition, the fixed electrode must be formed thick. For this reason, the following problem arises. Specifically, the process becomes complicated, and as a result, the cost increases.

BRIEF SUMMARY OF THE INVENTION

According to a first aspect of the present invention, there is provided a micro-electro-mechanical system (MEMS) comprising: a first electrode interposed between a first fixed end and a second fixed end, the first electrode being movable by an actuator element.

A shape from the first electrode to the first fixed end and a shape from the first electrode to the second fixed end are asymmetrical.

According to a second aspect of the present invention, there is provided a micro-electro-mechanical system (MEMS) comprising: a first fixed end formed on a substrate; a second fixed end formed on the substrate separating from the first fixed end; a first actuator whose one end is connected to a first fixed end; a second actuator whose one end is connected to a second fixed end; a first electrode arranged between the other end of the first actuator and the other end of the second actuator; and a spring structure member arranged at one of (i) a position between the first fixed end and the first electrode and (ii) a position between the second fixed end and the first electrode.

According to a third aspect of the present invention, there is provided a micro-electro-mechanical system (MEMS) comprising: a first fixed end formed on a substrate; a second fixed end formed on the substrate separating from the first fixed end; a beam having one end fixed to the first fixed end and the other end fixed to the second fixed end so that a cavity is formed between the beam and the substrate; a first electrode formed on a surface of the beam facing the substrate; a first actuator arranged in the beam between the first fixed end and the first electrode; a second actuator arranged in the beam between the second fixed end and the first electrode; and a spring structure member arranged in the beam between the first electrode and the second actuator.

The beam is set so that a spring constant between the first actuator and the first electrode differs from a spring constant between the second actuator and the first electrode.

DETAILED DESCRIPTION OF THE INVENTION

Various embodiments of the present invention will be hereinafter described with reference to the accompanying drawings. In the following description, the same reference numerals are used to designate common portions over all drawings.

First Embodiment

A MEMS device according to a first embodiment of the invention will be hereinafter described.

Figure 1:
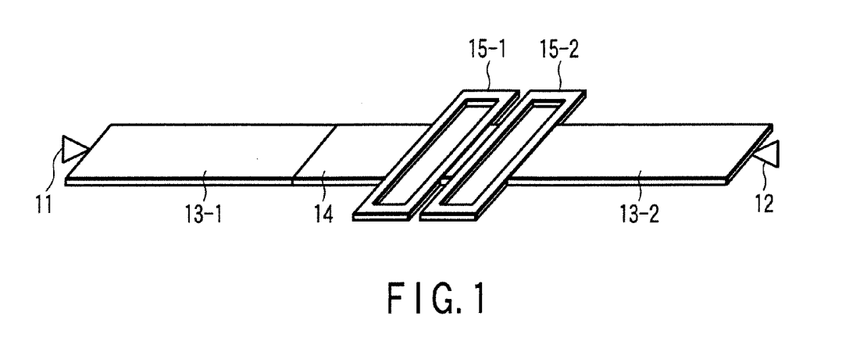
FIG. 1 is a perspective view showing the structure of a MEMS device according to a first embodiment of the present invention.

FIG. 1 is a perspective view showing the structure of a MEMS device according to a first embodiment.

The MEMS device has a bridge structure given in a manner that a beam is supported by a first and a second fixed end 11 and 12. As shown in FIG. 1, the first fixed end 11 is connected with one end of a first piezoelectric type actuator 13-1. The second fixed end 12 is connected with one end of a second piezoelectric type actuator 13-2. The other end of the first piezoelectric type actuator 13-1 is connected with one end of an electrode 14. The other end of the electrode 14 is connected to the other end of the second piezoelectric type actuator 13-2 via spring structure members (flexure structure members) 15-1 and 15-2. As described above, the MEMS device of the first embodiment has the following asymmetrical structure given on both sides of the electrode 14. One is a structure from the electrode 14 to the first fixed end 11. Another is a structure from the electrode 14 to the second fixed end 12. In other words, a shape from the electrode 14 to the first fixed end differs from a shape from the electrode 14 to the second fixed end 12.

The effect of the MEMS device having the structure shown in FIG. 1 will be hereinafter explained as compared with the following MEMS device. The MEMS device has structures symmetrically given on the electrode 14 as illustrated in FIG. 3A.

Figure 3A:
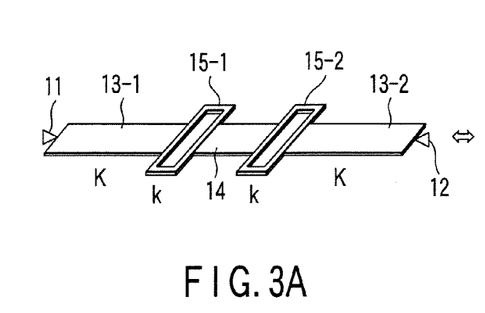
FIG. 3A is a perspective view showing a MEMS device having a spring structure member symmetrically arranged.

FIG. 3A is a perspective view showing a MEMS device having a structure from the electrode 14 to the first fixed end 11 and a structure from the electrode 14 to the second fixed end 12, which are symmetrically formed. Piezoelectric type actuators 13-1 and 13-2 are provided on both sides of the electrode 14 via spring structure members 15-1 and 15-2.

Figure 2A:
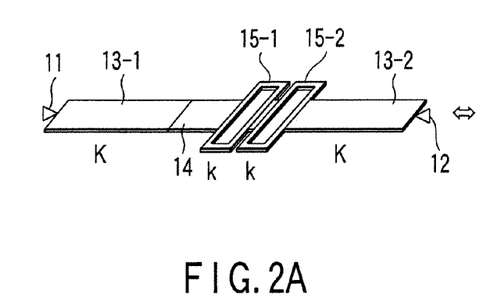
FIG. 2A is a perspective view showing the structure of the MEMS device according to the first embodiment.
Figure 2B:
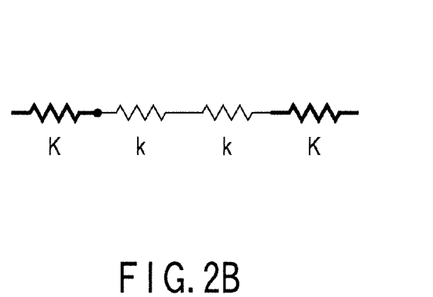
FIG. 2B is a view showing a spring constant between first and second fixed ends corresponding to FIG. 2A.
Figure 3B:
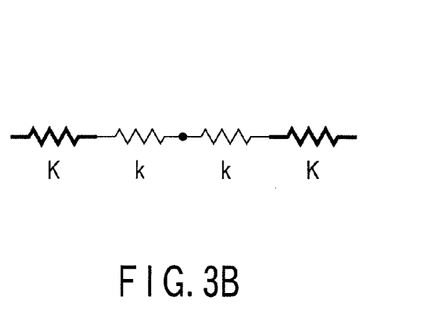
FIG. 3B is a view showing a spring constant between first and second fixed ends corresponding to FIG. 3A.

FIG. 2A shows the MEMS device of the first embodiment. FIG. 2B is a view showing a spring constant between first and second fixed ends corresponding to FIG. 2A. FIG. 3B a view showing a spring constant between first and second fixed ends corresponding to FIG. 3A.

As seen from FIG. 2B and FIG. 3B, the spring constant between the first and second fixed ends 11 and 12 has no change, that is, $K_1=kK/(2k+2K)$ even if spring structure members 15-1 and 15-2 are asymmetrically or symmetrically arranged. In this case, each spring constant of the first and second piezoelectric type actuators 13-1 and 13-2 is set as K. Each spring constant of the spring structure members 15-1 and 15-2 is set as k. In the MEMS device having the bridge structure, the spring structure members are arranged to relax tensile stress. As seen from the foregoing description, the effect does not depend on the inserted position of the spring structure members. Thus, even if the spring structure members are given on one side only of the electrode like the first embodiment, the same effect is obtained. Specifically, the tensile stress is relaxed like the case where the spring structure members are arranged on both sides of the electrode.

Figure 4:
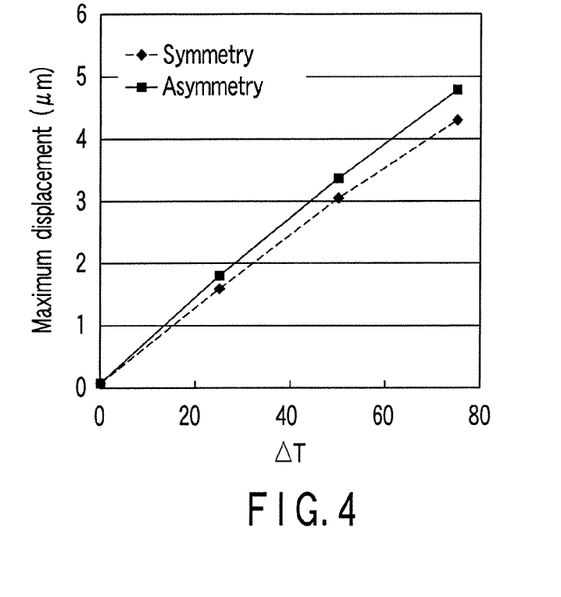
FIG. 4 is a graph showing a temperature dependency of the maximum displacement when a thermal type actuator is used in place of first and second piezoelectric type actuator in the MEMS device of the first embodiment.

The foregoing effect is confirmable from the simulation result shown in FIG. 4 expressing a temperature dependency of the maximum displacement of the electrode. FIG. 4 is a graph showing a temperature dependency of the maximum displacement when a thermal type actuator is used in place of first and second piezoelectric type actuator in the MEMS device of the first embodiment. The maximum displacement of the electrode in the asymmetrical spring structure members is larger than that in the symmetrical spring structure members. This results from the following reason. Specifically, the asymmetrical spring structure member obtains the same relaxed effect of tensile stress; in addition, the distance between the electrode and the actuator is close. As a result, the force of the actuator is easy to be transmitted. Here, the simulation result when the thermal type actuator is used in place of first and second piezoelectric type actuator is given. The same simulation result is obtained even if piezoelectric type or electrostatic type, electromagnetic type or hybrid type actuators combining those are used.

Figure 5A:
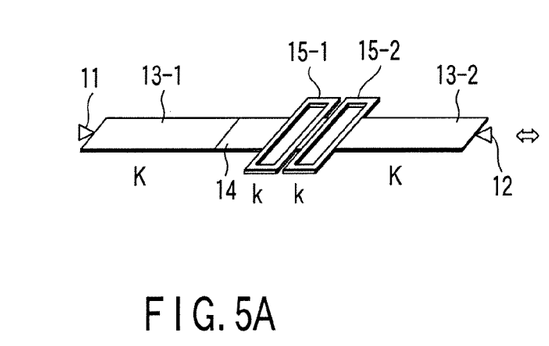
FIG. 5A is a perspective view showing the MEMS device of the first embodiment.
Figure 5B:
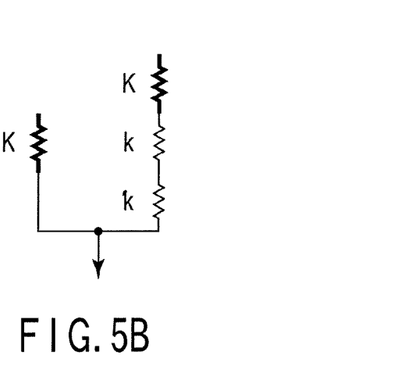
FIG. 5B is a view showing a spring constant between first and second fixed ends corresponding to FIG. 5A in view of an electrode.
Figure 6A:
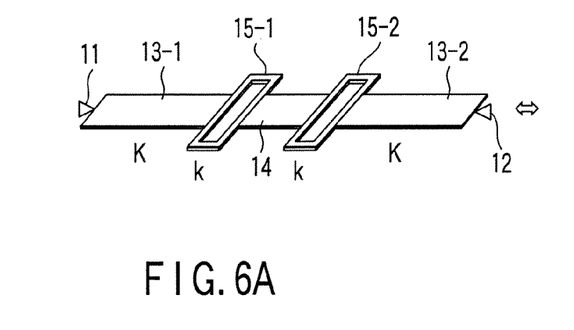
FIG. 6A is a perspective view showing a MEMS device having a spring structure member symmetrically arranged.
Figure 6B:
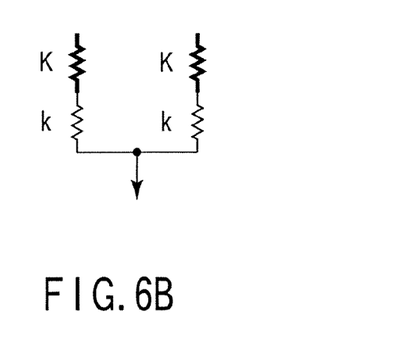
FIG. 6B is a view showing a spring constant between first and second fixed ends corresponding to FIG. 6A in view of an electrode.

FIG. 5A shows the MEMS device of the first embodiment. FIG. 5B is a view showing a spring constant between first and second fixed ends corresponding to FIG. 5A in view of the electrode. FIG. 6A shows the MEMS device having spring structure members symmetrically arranged like FIG. 3A. FIG. 6B is a view showing a spring constant between first and second fixed ends corresponding to FIG. 6A in view of the electrode.

According to the first embodiment, the spring structure members 15-1 and 15-2 are asymmetrically arranged. When $K \gg k$, a spring constant is $K_2=K+k/(2+k/K)=O(K)$ in view of the electrode 14 between the first and second fixed ends 11 and 12 as seen from FIG. 5B. In FIG. 6A, the spring structure members 15-1 and 15-2 are symmetrically arranged. A spring constant between first and second fixed ends 11 and 12 is $K_2'=2k/(1+k/K)=O(k)$ as seen from FIG. 6B. In this case, each spring constant of the first and second piezoelectric type actuators 13-1 and 13-2 is set as K. Each spring constant of the spring structure members 15-1 and 15-2 is set as k. Therefore, the following matter can be seen from the spring constant in view of the electrode. Namely, the spring constant in the case where the spring structure members are asymmetrically arranged is larger than that in the case where the spring structure members are symmetrically arranged. Thus, the MEMS device having spring structure members asymmetrically arranged has a strong force of restoring a top electrode. In other words, the restoring force acting on the electrode becomes large in the MEMS device having the following structure. Specifically, a MEMS device having the spring structure members on one side of the electrode has strong restoring force as compared with a MEMS device having spring structure members symmetrically arranged on both sides of the electrode.

Figure 7:
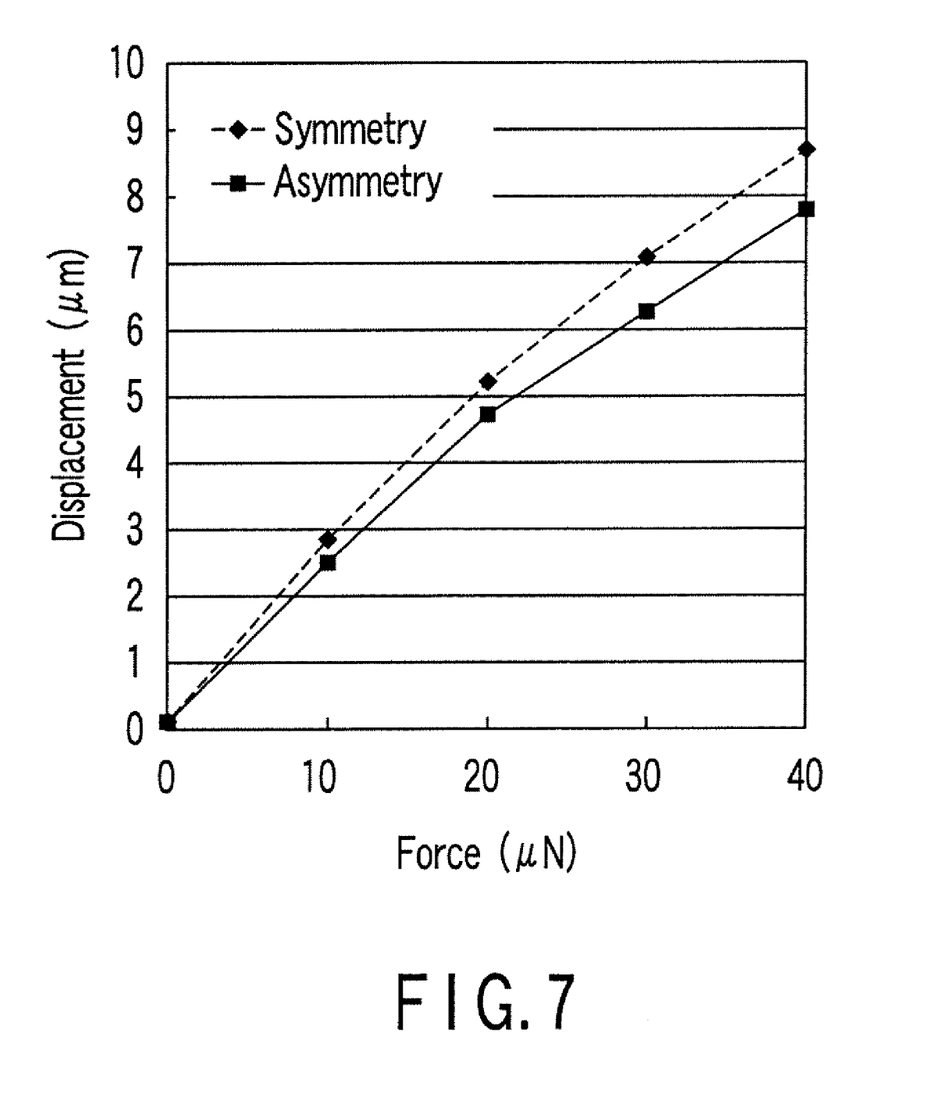
FIG. 7 is a graph showing a force dependency of the displacement when a thermal type actuator is used in place of first and second piezoelectric type actuator in the MEMS device of the first embodiment.

The foregoing effect is confirmable from FIG. 7, that is, a simulation result of displacement when force is applied to the electrode. FIG. 7 shows the case where a thermal type actuator is used in place of first and second piezoelectric type actuators in the MEMS device of the first embodiment. The displacement of the electrode in the asymmetrical spring structure members becomes smaller than that in the symmetrical spring structure members. This means that the restoring force of the asymmetrical spring structure members is larger than that of the symmetrical spring structure members. In other words, the MEMS device having the asymmetrical spring structure members has a strong force of restoring the top electrode as compared with the MEMS device having the symmetrical spring structure members. In this case, the simulation result when the thermal type actuator is used in place of first and second piezoelectric type actuators is given. The same simulation result is obtained even if piezoelectric type or electrostatic type, electromagnetic type or hybrid type actuators combining those are used.

Second Embodiment

A MEMS device according to a second embodiment of the invention will be described below. According to the second embodiment, a variable capacitor using a MEMS device having piezoelectric type and electrostatic type actuators will be described.

Figure 8:
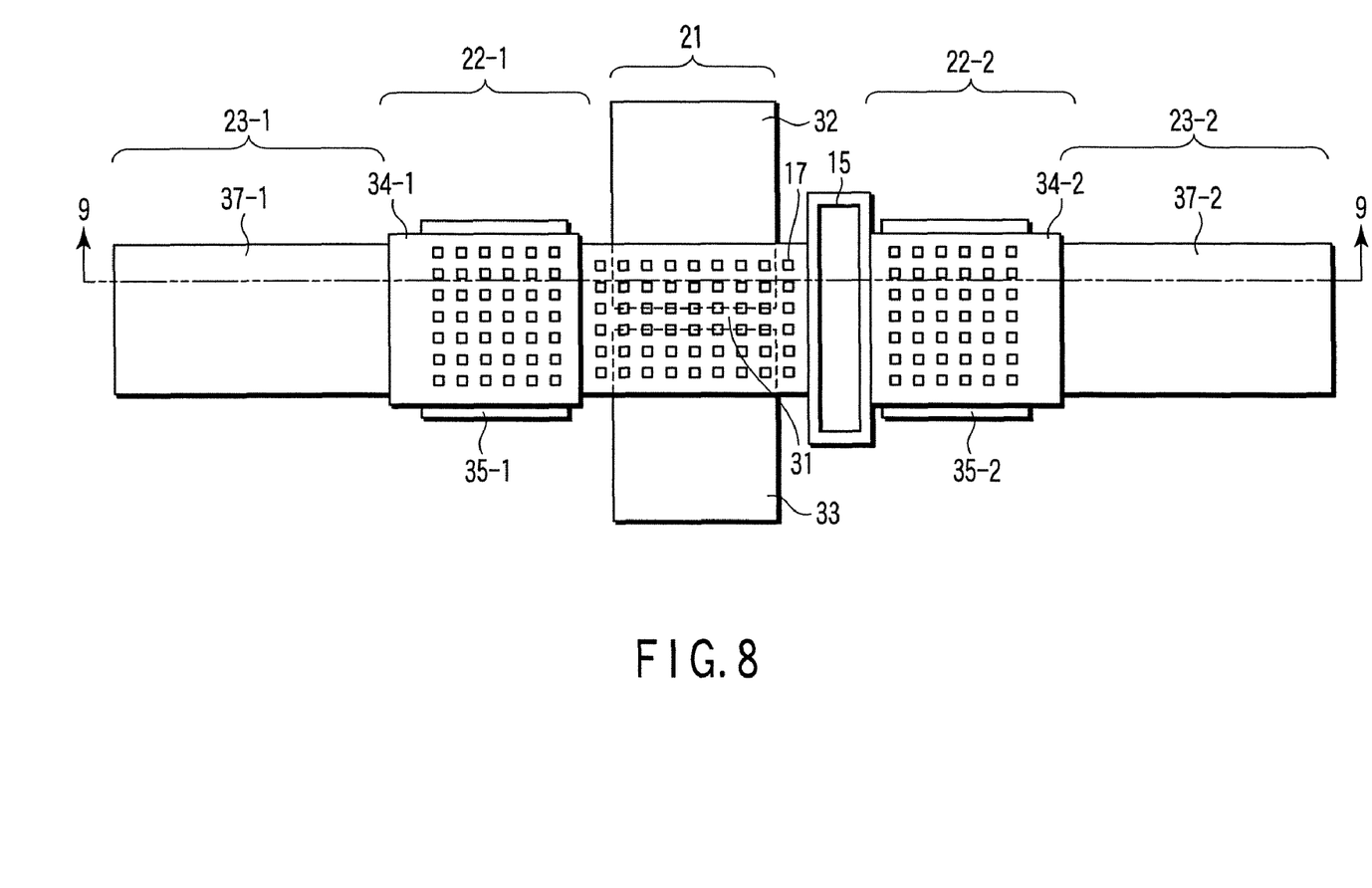
FIG. 8 is a top plan view showing a variable capacitor using a MEMS device according to a second embodiment of the present invention.
Figure 9:
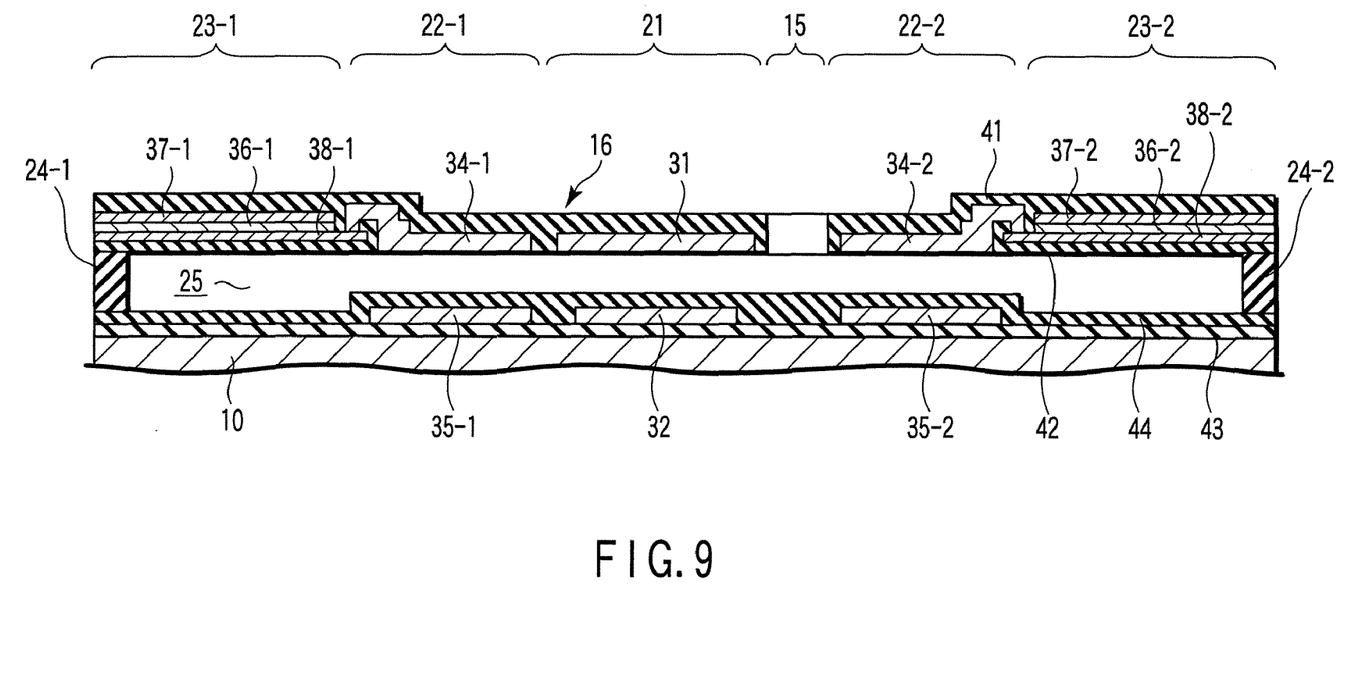
FIG. 9 is a cross-sectional view taken along the line 9-9 of FIG. 8.

FIG. 8 is a top plan view showing a variable capacitor using a MEMS device of the second embodiment. FIG. 9 is a cross-sectional view taken along the line 9-9 of FIG. 8.

The variable capacitor using a MEMS device includes variable capacitance member 21, electrostatic type actuators 22-1, 22-2, piezoelectric type actuators 23-1, 23-2 and spring structure member 15. Anchors 24-1 and 24-2 are arranged on a semiconductor substrate 10 separate from each other. A beam, that is elastic member 16 is fixed to these anchors 24-1 and 24-2 at both its ends. In the structure in which both ends of the elastic member 16 are fixed to anchors 24-1 and 24-2 on the semiconductor substrate 10, the following components are linearly arranged along one direction. The components are piezoelectric type actuator 23-1, electrostatic type actuator 22-1, variable capacitance member 21, spring structure member 15, electrostatic type actuator 22-2 and piezoelectric type actuator 23-2. A cavity 25 is formed between the semiconductor substrate 10 and the elastic member 16. Piezoelectric type actuators 23-1, 23-2, electrostatic type actuators 22-1 and 22-2 are actuated, and thereby, the center portion of the elastic member 16 is deformed to close to the semiconductor substrate 10.

The variable capacitance member 21 includes a top electrode 31 formed in the elastic member 16, and bottom electrodes 32 and 33 formed on the semiconductor substrate 10. The top electrode 31 becomes a floating state, and actuators 22-1, 22-2, 23-1 and 23-2 are actuated, and thereby, the distance between the top electrode 31 and bottom electrodes 32, 33 changes. The top electrode 31 of the variable capacitance member 21 is lowered to the bottom electrodes side by actuators 22-1, 22-2, 23-1 and 23-2, and thereby, the top electrode 31 closes to bottom electrodes 32 and 33. By doing so, bottom electrodes 32 and 33 are combined in its capacitance. In a state that the top electrode 31 is upwardly positioned, a gap of 1.5 μm is formed between the top electrode 31 and an insulating film 44. Therefore, in this state, the capacitance between the bottom electrodes 32 and 33 becomes so small as possible to disregard. As described above, the top electrode 31 is vertically moved, and thereby, a digital variable capacitor is formed. In the digital variable capacitor, the capacitance value between the bottom electrodes 32 and 33 has a binary change.

The following is an explanation about a hybrid type actuator controlling an inter-electrode distance of the variable capacitance member 21 and the spring structure member 15. The hybrid type actuator has the electrostatic type actuators 22-1, 22-2, and the piezoelectric type actuators 23-1 and 23-2. The electrostatic type actuator 22-1 is arranged on one end side of the variable capacitance member 21. The electrostatic type actuator 22-1 is composed of the top electrode 34-1 and the bottom electrode 35-1. The electrostatic type actuator 22-2 is arranged on the other end side of the variable capacitance member 21 via the spring structure member 15. The electrostatic type actuator 22-2 is composed of the top electrode 34-2 and the bottom electrode 35-2.

Piezoelectric type actuators 23-1 and 23-2 are provided between electrostatic type actuator 22-1 and anchor 24-1 and between electrostatic type actuator 22-2 and anchor 24-2, respectively. These piezoelectric type actuators 23-1 and 23-2 have piezoelectric films 36-1, 36-2, piezoelectric drive top electrodes 37-1, 37-2, and bottom electrodes 38-1, 38-2, respectively. In this case, these top electrodes 37-1 and 37-2 are provided on the bottom electrodes 38-1 and 38-2 via piezoelectric films 36-1 and 36-2. For example, AlN and PZT are used as the material for these piezoelectric films 36-1 and 36-2.

An insulating film 41 is formed on the top electrode 31 of the variable capacitance member 21, the top electrodes 34-1, 34-2 of electrostatic type actuators 22-1, 22-2 and the top electrodes 37-1, 37-2 of piezoelectric type actuators 23-1, 23-2. An insulating film 42 is formed under bottom electrodes 38-1 and 38-2 of piezoelectric type actuators 23-1 and 23-2. Moreover, an insulating film 43 is formed on the semiconductor substrate 10. The bottom electrodes 32 and 33 of the variable capacitance member 21 and the bottom electrodes 35-1 and 35-2 of the electrostatic type actuators 22-1 and 22-2 are formed on the insulating film 43. An insulating film 44 is formed on these bottom electrodes 32, 33, 35-1, 35-2 and the insulating film 43. As shown in FIG. 8, the top electrodes 31, 34-1 and 34-2 are formed with holes 17 like a matrix. The holes 17 are used for performing uniform etching in an etching process for forming the cavity 25. These holes 17 contribute for reducing air resistance, and serve to perform high-speed switching. Of course, the holes 17 are not always formed, and even if no hole 17 is formed, the essential effect of this embodiment has no change.

The foregoing structure is given, and thereby, potential difference is applied between the top electrodes 37-1, 37-2 and the bottom electrodes 38-1, 38-2 in the piezoelectric type actuators 23-1 and 23-2. By doing so, the piezoelectric films 36-1 and 36-2 displace so that the center portion of the elastic member 16 downwardly displaces. Both unimolf type and bimolf type actuator are used as the piezoelectric type actuators 23-1 and 23-2. The first potential difference is applied between the top electrodes 37-1 and 37-2 and the bottom electrodes 38-1 and 38-2 in the piezoelectric type actuators 23-1 and 23-2 to downwardly displace top electrodes 31, 34-1 and 34-2. By doing so, the top electrodes 34-1, 34-2 close to the bottom electrodes 35-1, 35-2. In this state, the second potential difference is applied between the top electrodes 34-1, 34-2 and the bottom electrodes 35-1, 35-2, respectively. The second potential difference may be the same as the first potential difference, or may be smaller or larger than the first potential difference. Thus, the top electrode 31 of the variable capacitance member 21 further downwardly displaces, and thereby, the distance between the top electrode 31 and bottom electrodes 32, 33 becomes narrow. Therefore, the capacitance value of the variable capacitance member 21 has a binary change.

In order to restore the top electrode 31 of the variable capacitance member 21 after to upwardly displace it, the following operation is made. Specifically, the potential difference of electrostatic type actuators 22-1 and 22-2 is offset, and thereafter or simultaneously, the potential difference of piezoelectric type actuators 23-1 and 23-2 is offset.

According to the foregoing structure, the spring structure member 15 is interposed between the variable capacitance member 21 and the electrostatic type actuator 22-2. In other words, the spring structure member 15 is interposed between the top electrodes 31 and 34-2. Thus, tensile stress of the elastic member 16 between the anchors 24-1 and 24-2 is relaxed. By doing so, the displacement of the top electrode 31 of the variable capacitance member 21 increases. Therefore, it is possible to reduce a force required for downwardly displacing the top electrode 31.

Moreover, the spring structure member 15 is interposed between one side of the variable capacitance member 21 and the electrostatic type actuator 22-2. In this case, the top electrode 31 is restored from a state that it contacts with the insulating film 44. Thus, a force of restoring the top electrode 31 is larger than the case where the spring structure member is arranged on both side of the top electrode 31.

As described above, according to the second embodiment, the spring structure member 15 is interposed between one side of the variable capacitance member 21 and the electrostatic type actuator 22-2. By doing so, the tensile stress between anchors is relaxed. Moreover, the displacement of the top electrode 31 increases while it is possible to reduce a force required for downwardly displacing the top electrode 31. Simultaneously, a restoring force acting on the top electrode 31 is improved in a state that the top electrode 31 contacts with the insulating film 44.

According to the second embodiment, the spring structure member 15 is arranged on one side only of the top electrode 31 of the variable capacitance member 21. For example, the spring structure members may be arranged on both sides of the top electrode of the variable capacitance member. In this case, the spring constant of one spring structure member may be set to a value different from that of the other spring structure member. By doing so, the same effect as above is obtained.

Third Embodiment

A MEMS device according to a third embodiment of the invention will be hereinafter described. The same reference numerals are used to designate portions identical to the second embodiment, and the details are omitted. According to the third embodiment, a variable capacitor using a MEMS device having a piezoelectric type actuator will be explained.

Figure 10:
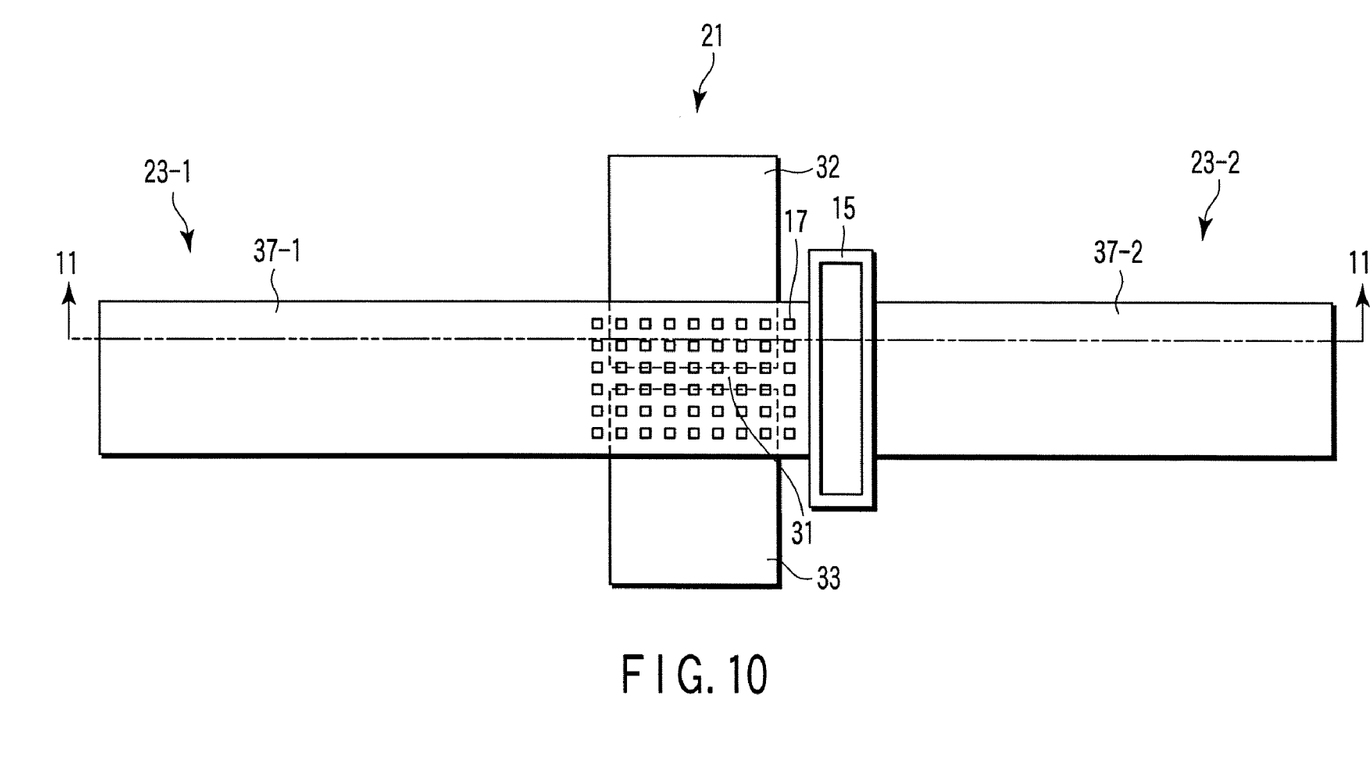
FIG. 10 is a top plan view showing a variable capacitor using a MEMS device according to a third embodiment of the present invention.
Figure 11:
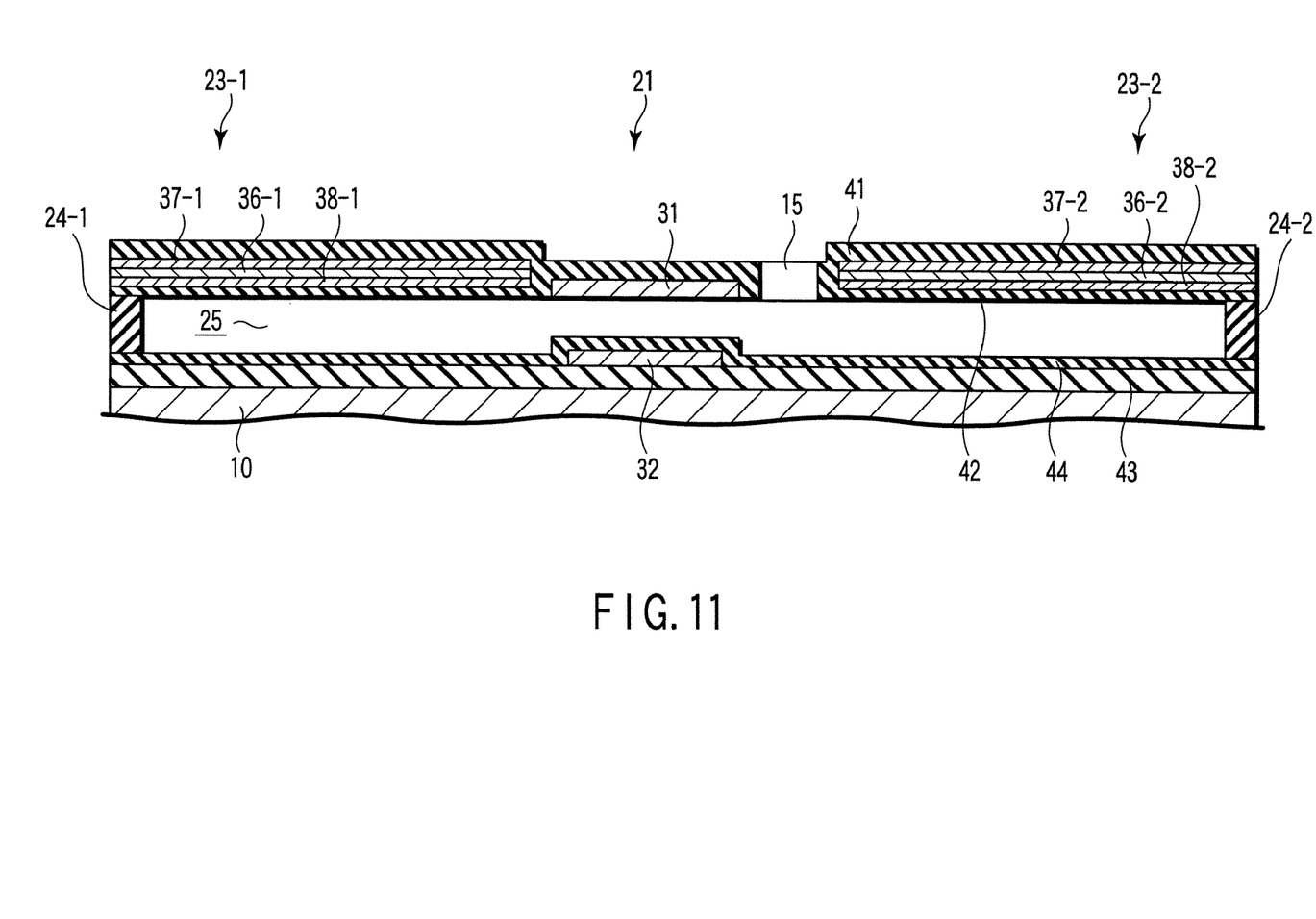
FIG. 11 is a cross-sectional view taken along the line 11-11 of FIG. 10.

FIG. 10 is a top plan view showing a variable capacitor using a MEMS device according to the third embodiment. FIG. 11 is a cross-sectional view taken along the line 11-11 of FIG. 10.

The variable capacitor using the MEMS device includes the variable capacitance member 21, piezoelectric type actuators 23-1, 23-2 and the spring structure member 15. According to the third embodiment, these piezoelectric type actuators 23-1 and 23-2 are actuated, and thereby, the distance between the top electrode 31 and the bottom electrodes 32, 33 is changed. By doing so, it is possible to form a digital variable capacitor in which the capacitance value between bottom electrodes 32 and 33 has a binary change.

The piezoelectric type actuator controlling the inter-electrode distance of the variable capacitance member 21 and the spring structure member 15 will be described below. The piezoelectric type actuator 23-1 is arranged on one end side of the variable capacitance member 21. The piezoelectric type actuator 23-2 is arranged on the other end side of the variable capacitance member 21 via the spring structure member 15. These piezoelectric type actuators 23-1 and 23-2 are further connected to anchors 24-1 and 24-2, respectively.

An insulating film 41 is formed on the top electrode 31 of the variable capacitance member 21 and the top electrodes 37-1, 37-2 of the piezoelectric type actuators 23-1, 23-2. An insulating film 42 is formed under bottom electrodes 38-1, 38-2 of the piezoelectric type actuators 23-1, 23-2. Moreover, an insulating film 43 is formed on the semiconductor substrate 10. Bottom electrodes 32 and 33 of the variable capacitance member 21 are formed on the insulating film 43. An insulating film 44 is formed on these bottom electrodes 32, 33 and insulating film 43.

The foregoing structure is given, and thereby, a potential difference is applied between the top electrodes 37-1, 37-2 and the bottom electrodes 38-1, 38-2 in piezoelectric type actuators 23-1, 23-2. By doing so, piezoelectric films 36-1 and 36-2 displace; as a result, the beam downwardly displaces. Thus, the top electrode 31 of the variable capacitance member 21 displaces onto the side of bottom electrodes 32, 33. Therefore, the distance between the top electrode 31 and the bottom electrodes 32, 33 becomes narrow, and the capacitance value of the variable capacitance member 21 has a binary change. In order to restore the top electrode 31 of the variable capacitance member 21 after to upwardly displace it, the potential difference of piezoelectric type actuators 23-1, 23-2 is offset.

According to the foregoing structure, the spring structure member 15 is interposed between the variable capacitance member 21 and the piezoelectric type actuator 23-2. Thus, the tensile stress acting on the beam between anchors 24-1 and 24-2 is relaxed. By doing so, the displacement of the top electrode 31 increases in the variable capacitance member 21. This serves to reduce a force required for downwardly displacing the top electrode 31.

Moreover, the spring structure member 15 is interposed between one side of the variable capacitance member 21 and the piezoelectric type actuator 23-2. When the top electrode 31 is restored from the insulating film 44 on bottom electrodes 32 and 33, the restoring force is larger than the case where spring structure members are arranged on both side of the top electrode 31. Other structure and effect are the same as the second embodiment.

Fourth Embodiment

A MEMS device according to a fourth embodiment of the invention will be hereinafter described. The same reference numerals are used to designate portions identical to the second embodiment, and the details are omitted. According to the fourth embodiment, a variable capacitor using a MEMS device having an electrostatic type actuator will be explained.

Figure 12:
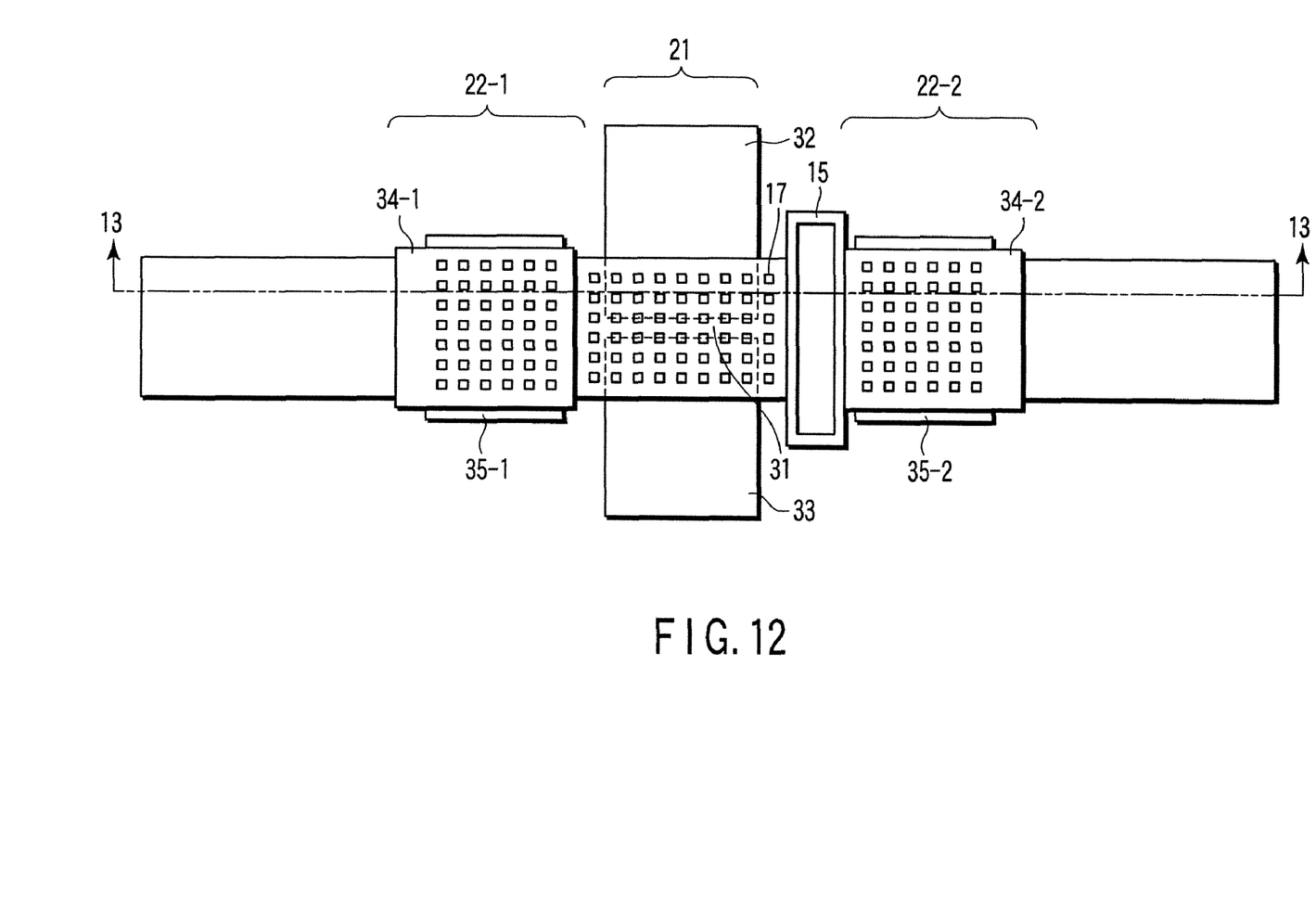
FIG. 12 is a top plan view showing a variable capacitor using a MEMS device according to a fourth embodiment of the present invention.
Figure 13:
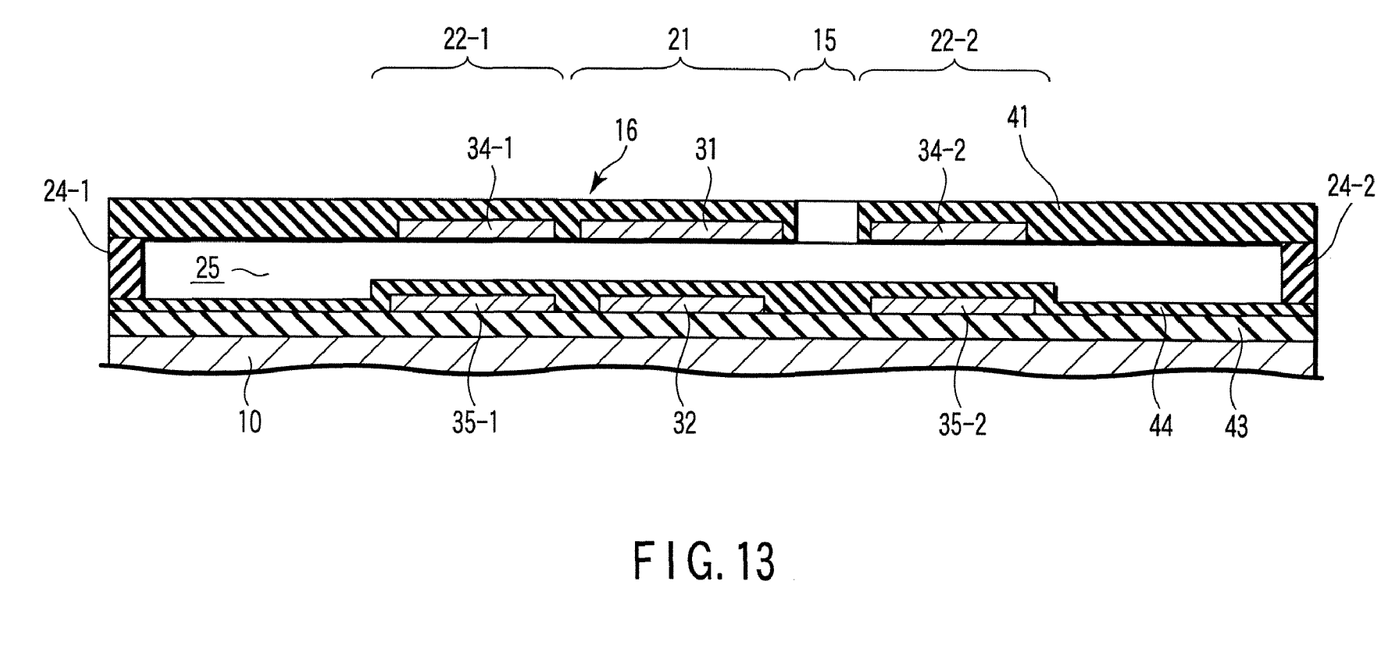
FIG. 13 is a cross-sectional view taken along the line 13-13 of FIG. 12.

FIG. 12 is a top plan view showing a variable capacitor using a MEMS device according to the fourth embodiment. FIG. 13 is a cross-sectional view taken along the line 13-13 of FIG. 12.

The variable capacitor using the MEMS device includes the variable capacitance member 21, the electrostatic type actuators 22-1, 22-2 and the spring structure member 15. According to the fourth embodiment, electrostatic type actuators 22-1 and 22-2 are actuated, and thereby, the distance between the top electrode 31 and bottom electrodes 32, 33 is changed. By doing so, it is possible to form a digital variable capacitor in which the capacitance value between bottom electrodes 32 and 33 has a binary change.

The electrostatic type actuator controlling the inter-electrode distance of the variable capacitance member 21 and the spring structure member 15 will be described below. The electrostatic type actuator 22-1 is arranged on one end side of the variable capacitance member 21. The electrostatic type actuator 22-2 is arranged on the other end side of the variable capacitance member 21 via the spring structure member 15. These electrostatic type actuators 22-1 and 22-2 are further connected to anchors 24-1 and 24-2, respectively.

An insulating film 41 is formed on the top electrode 31 of the variable capacitance member 21 and the top electrodes 34-1, 34-2 of the electrostatic type actuators 22-1, 22-2. Moreover, an insulating film 43 is formed on the semiconductor substrate 10. The bottom electrodes 32 and 33 of the variable capacitance member 21 and the bottom electrodes 35-1, 35-2 of electrostatic type actuators 22-1, 22-2 are formed on the insulating film 43. An insulating film 44 is formed on these bottom electrodes 32, 33, 35-1, 35-2 and insulating film 43.

The foregoing structure is given, and thereby, potential difference is applied between the top electrodes 34-1, 34-2 and the bottom electrodes 35-1, 35-2 in electrostatic type actuators 22-1 and 22-2, respectively. By doing so, the center portion of the elastic member 16 downwardly moves. Thus, the top electrode 31 of the variable capacitance member 21 displaces onto the side of bottom electrodes 32 and 33. Therefore, the distance between the top electrode 31 and the bottom electrodes 32, 33 becomes narrow, and thereby, the capacitance value of the variable capacitance member 21 has a binary change. In order to restore the top electrode 31 of the variable capacitance member 21 after to upwardly displace it, the potential difference applied to electrostatic type actuators 22-1 and 22-2 is offset.

According to the foregoing structure, the spring structure member 15 is interposed between the variable capacitance member 21 and the electrostatic type actuator 22-2. Thus, the tensile stress acting on the beam between anchors 24-1 and 24-2 is relaxed. By doing so, the displacement of the top electrode 31 increases in the variable capacitance member 21. This serves to reduce a force required for downwardly displacing the top electrode 31.

Moreover, the spring structure member 15 is interposed between one side of the variable capacitance member 21 and the electrostatic type actuator 22-2. When the top electrode 31 is restored from the insulating film 44 on bottom electrodes 32 and 33, the restoring force is larger than the case where spring structure members are arranged on both side of the top electrode 31. Other structure and effect are the same as the second embodiment.

Fifth Embodiment

A MEMS device according to a fifth embodiment of the invention will be hereinafter described. The same reference numerals are used to designate portions identical to the second embodiment, and the details are omitted. According to the fifth embodiment, a capacitive switch using a MEMS device having an electrostatic type actuator will be explained.

Figure 14:
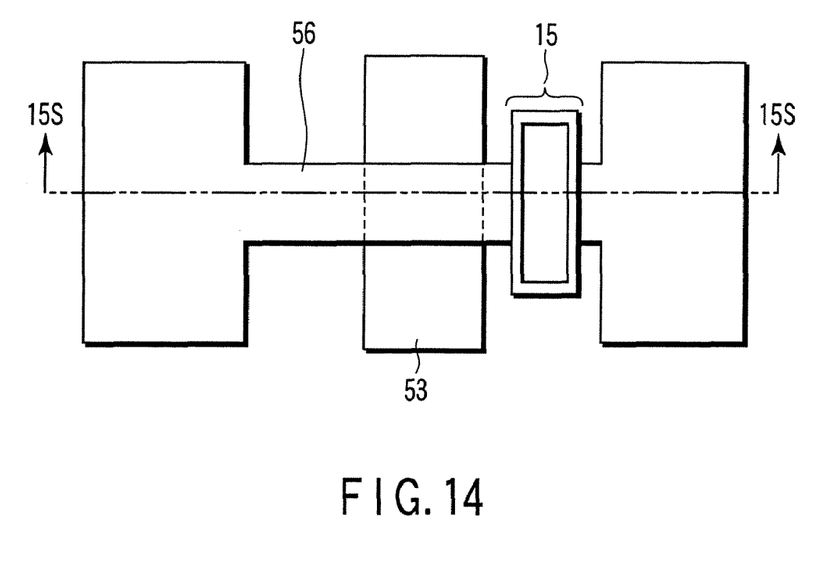
FIG. 14 is a top plan view showing a capacitive switch using a MEMS device according to a fifth embodiment of the present invention.
Figure 15:
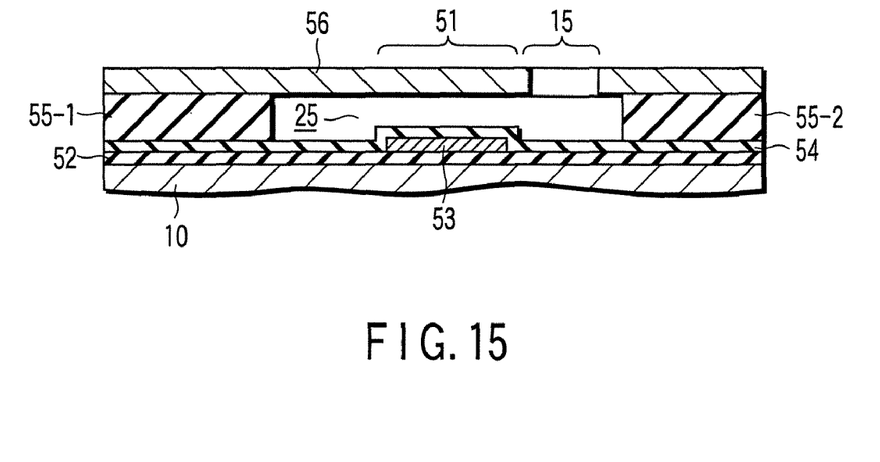
FIG. 15 is a cross-sectional view taken along the line 15S-15S of FIG. 14.

FIG. 14 is a top plan view showing a capacitive switch using a MEMS device according to the fifth embodiment. FIG. 15 is a cross-sectional view taken along the line 15S-15S of FIG. 14.

The capacitive switch using the MEMS device includes a switch member 51 and the spring structure member 15. An insulating film 52 is formed on a semiconductor substrate 10. A bottom electrode 53 of the switch member 51 is formed on the insulating film 52. Moreover, an insulating film 54 is formed on the bottom electrode 53 and the insulating film 52 to cover the bottom electrode 53.

Insulating films 55-1 and 55-2 are formed on the semiconductor substrate 10 separate from each other. Both ends of a top electrode 56 are fixed onto these insulating films 55-1 and 55-2. A cavity 25 is formed between the semiconductor substrate 10 and the top electrode 56.

The switch member 51 is composed of top electrode 56, bottom electrode 53, and insulating film 54 on the bottom electrode 53. The switch 51 functions as an electrostatic actuator, and the top electrode 56 and the bottom electrode 53 are used as an electrode of the electrostatic actuator. The spring structure member 15 is interposed between the top electrode 56 forming the switch member 51 and the top electrode 56 on the insulating film 55-2. The top electrode 56 is supplied with a ground voltage while the bottom electrode 53 is supplied with a signal voltage. In the capacitive switch having the foregoing structure, the top electrode 56 vertically moves, and thereby, the distance between the bottom electrode 53 and the top electrode 56 changes. By doing so, the capacitance value between the bottom electrode 53 and the top electrode 56 changes.

According to the foregoing structure, the spring structure member 15 is interposed between the top electrode 56 forming the switch member 51 and the top electrode 56 on the insulating film 55-2. The tensile stress of the top electrode 56 between insulating films 55-1 and 55-2 is relaxed. By doing so, the displacement of the top electrode 56 is increased; therefore, this serves to reduce a force required for downwardly displacing the top electrode 56.

Moreover, the spring structure member 15 is interposed between one side of the switch member 51 and the insulating film 55-2 using the switch member as a reference. When the top electrode 56 is restored from a state that it contacts with the insulating film 54, the restoring force is larger as compared with the case where the spring structure members are arranged on both sides of the switch member 51.

According to the fifth embodiment, the spring structure member 15 is interposed between one side of the switch member 51 and the insulating film 55-2. By doing so, the tensile stress of the top electrode 56 between insulating films 55-1 and 55-2 is relaxed. Thus, the displacement of the top electrode 56 is increased, and therefore, this serves to reduce a force required for downwardly displacing the top electrode 56. Simultaneously, a restoring force acting on the top electrode 56 is improved in a state that the top electrode 56 contacts with the insulating film 54.

Sixth Embodiment

A MEMS device according to a sixth embodiment of the present invention will be hereinafter described. The same reference numerals are used to designate portions having the same configuration and effect as the second embodiment, and the explanation is omitted. According to the foregoing embodiments, the MEMS device is applied to the variable capacitor and the capacitive switch. In this case, the MEMS device is applicable to a contact type switch. The sixth embodiment relates to a contact type switch using a MEMS device having an electrostatic actuator.

Figure 16:
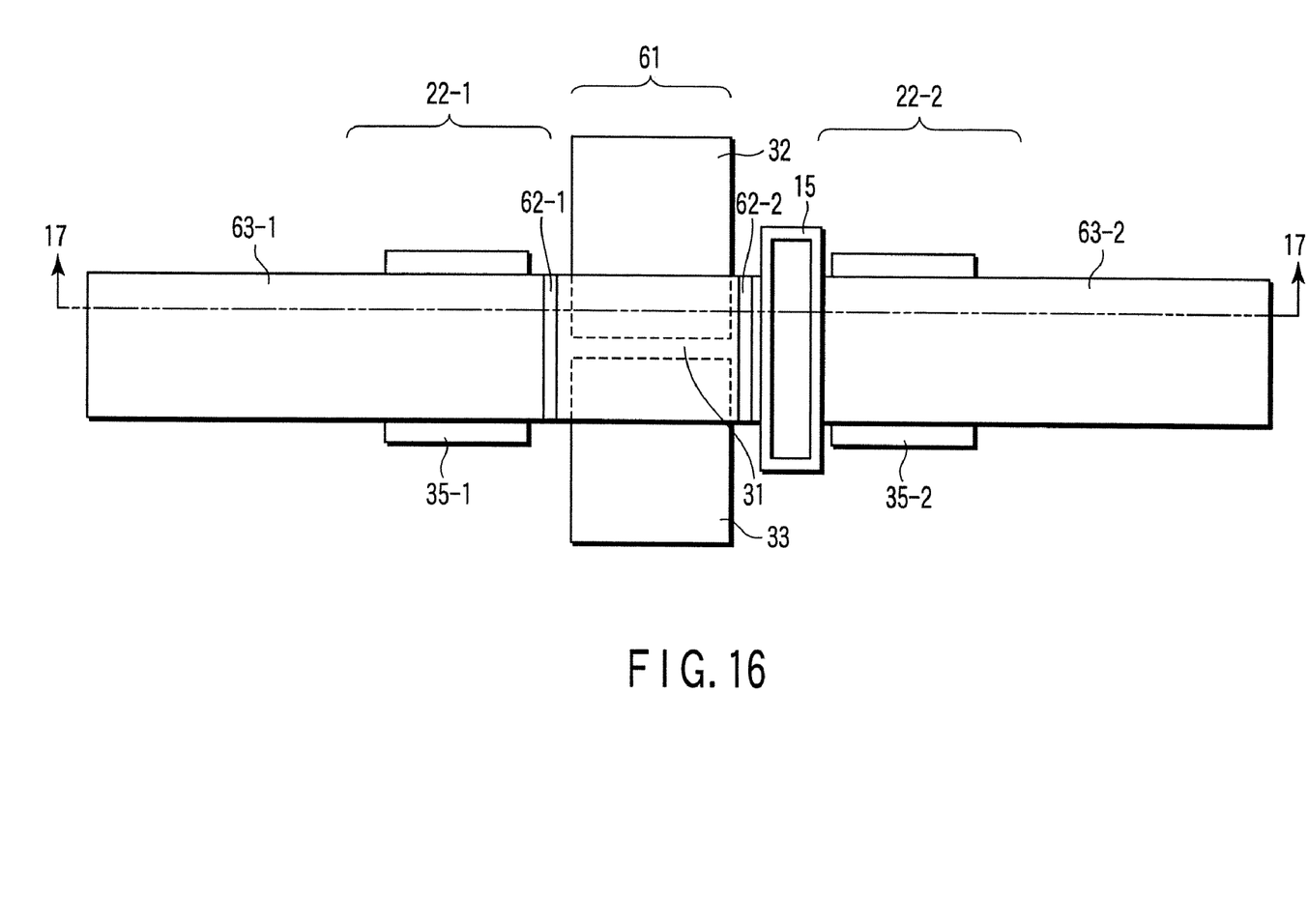
FIG. 16 is a top plan view showing a switch using a MEMS device according to a sixth embodiment of the present invention.
Figure 17:
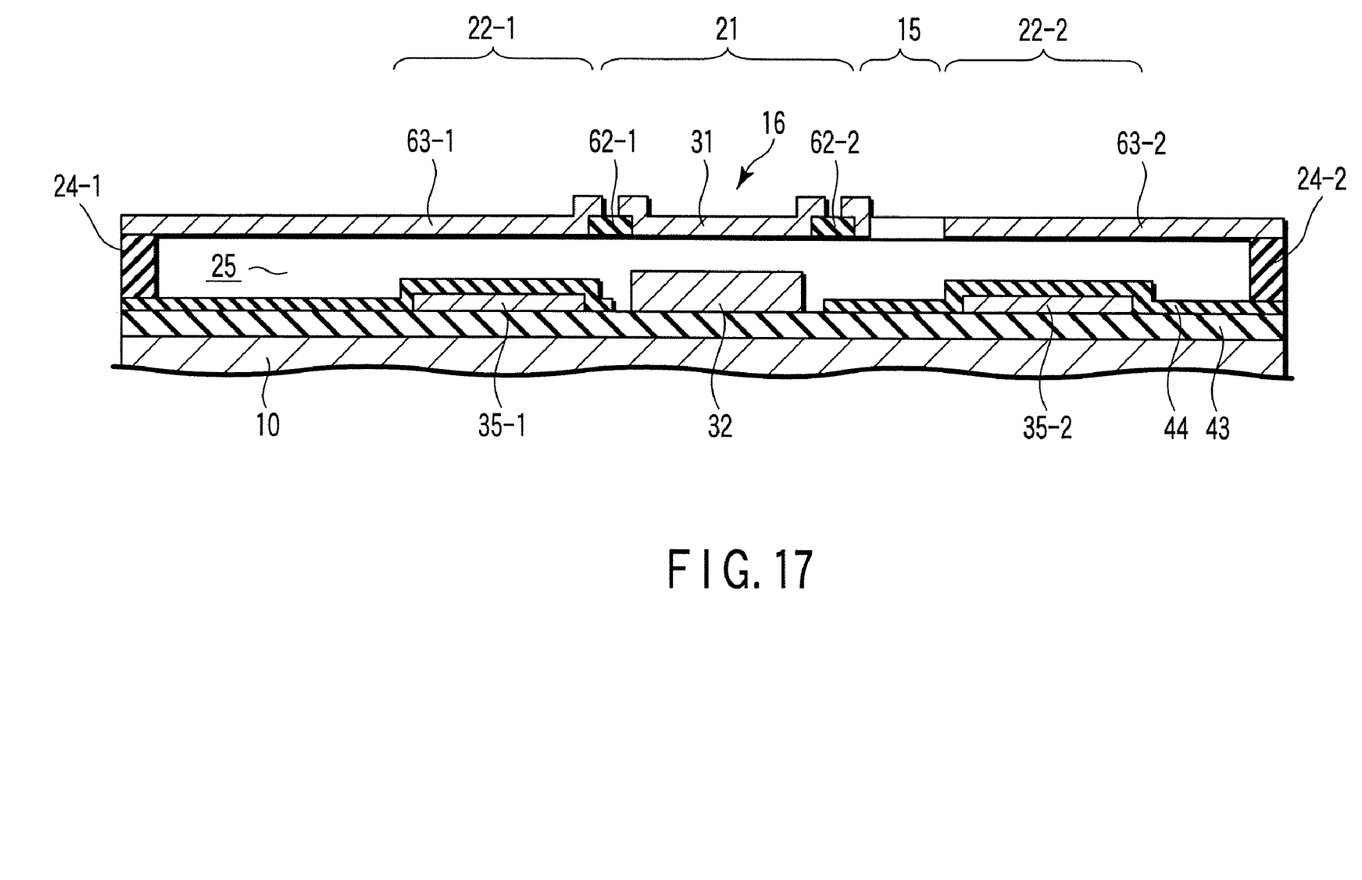
FIG. 17 is a cross-sectional view taken along the line 17-17 of FIG. 16.

FIG. 16 is a top plan view showing a switch using a MEMS device according to a sixth embodiment. FIG. 17 is a cross sectional view taken along the line 17-17 of FIG. 16.

The switch using the MEMS device includes a switch 61, insulators 62-1, 62-2, electrostatic actuators 22-1, 22-2 and a spring structure member 15. According to the sixth embodiment, the foregoing electrostatic actuators 22-1 and 22-2 are actuated, and thereby, the top electrode 31 contacts with the bottom electrodes 32 and 33. By doing so, a conductive state is given between the bottom electrodes 32 and 33. In other words, when the electrostatic actuators 22-1 and 22-2 are not actuated, a shut-off state is given between the bottom electrodes 32 and 33. On the other hand, when the electrostatic actuators 22-1 and 22-2 are actuated so that the top electrode 31 contacts with the bottom electrodes 32 and 33, a conductive state is given between the bottom electrodes 32 and 33. As is evident from the foregoing description, the switch can take a shut-off state (off state) and a conductive state (on state).

The electrostatic actuator controlling the inter-electrode distance of the switch 61 and the spring structure member 15 will be hereinafter described. The electrostatic actuator 22-1 is arranged on one side of the switch 61. The electrostatic actuator 22-2 is arranged on the other side of the switch 61 via the spring structure member 15. An insulator 62-1 is interposed between the top electrode 31 of the switch 61 and a top electrode 63-1 of the electrostatic actuator 22-1 to insulate these components. An insulator 62-2 is interposed between the top electrode 31 of the switch 61 and the spring structure member 15 to insulate these components. The top electrode 63-1 of the electrostatic actuator 22-1 is connected to the anchor 24-1. Moreover, a top electrode 63-2 of the electrostatic actuator 22-2 is connected to the anchor 24-2. An elastic member 16 is configured so that the top electrode 63-1 of the electrostatic actuator 22-1, the insulator 62-1, the top electrode 31 of the switch 61, the insulator 62-2, the spring structure member 15 and the top electrode 63-2 of the electrostatic actuator 22-2 are linearly arranged along one direction.

An insulating film 43 is formed on a semiconductor substrate 10. Bottom electrodes 32, 33 of the switch 61 and the bottom electrodes 35-1, 35-2 of the electrostatic actuators 22-1, 22-2 are formed on the insulating film 43. An insulating film 44 is formed on these bottom electrodes 35-1, 35-2 and the insulating film 43.

The foregoing structure is given, and thereby, a potential difference is applied between the top electrodes 63-1, 63-2 and the bottom electrodes 35-1, 35-2 in the electrostatic actuators 22-1 and 22-2. By doing so, the center portion of the elastic member 16 downwardly moves. Thus, the top electrode 31 of the switch 61 displaces onto the side of the bottom electrodes 32 and 33 so that it contacts with these bottom electrodes 32 and 33. Therefore, a conductive state is given between the bottom electrodes 32 and 33, and thereby, the switch 61 becomes an on state. In order to restore the top electrode 31 of the switch 61 by upwardly displacing it, a potential difference is not given between the electrostatic actuators 22-1 and 22-2.

According to the structure, the spring structure member 15 is interposed between one side of the switch 61 and the electrostatic actuator 22-2. The tensile stress of the elastic member 16 between the anchors 24-1 and 24-2 is relaxed. By doing so, the displacement of the top electrode 31 of the switch 61 is increased. This serves to reduce a force required for downwardly displacing the top electrode 31. Moreover, when the top electrode 31 is restored from the bottom electrodes 32 and 33, the restoring force is larger in the case where the spring structure member 15 is arranged on one side only of the top electrode 31 as compared with the case where spring structure member is arranged on both sides of the top electrode 31.

According to the sixth embodiment, the spring structure member 15 is interposed between one side of the switch 61 and the electrostatic actuator 22-2. By doing so, the tensile stress between anchors is relaxed, and the displacement of the top electrode 31 increases. Therefore, this serves to reduce a force required for downwardly displacing the top electrode 31. In addition, in a state that the top electrode 31 contacts with the bottom electrodes 32 and 33, a restoring force acting on the top electrode 31 is improved.

According to the foregoing embodiments, the electrostatic actuator and the piezoelectric actuator are used. In this case, an electromagnetic or a thermal type actuator may be used in place of the preceding actuators.

According the foregoing embodiments of the invention, there is provided a MEMS device, which can relax the tensile stress of the beam provided with an electrode, and improve a restoring force of the electrode.

In the foregoing, each embodiment is solely carried out, and in addition, may be combined. Various inventive steps are included in the foregoing embodiments. Constituent components disclosed in the foregoing embodiments are properly combined, and thereby, various inventive steps are extracted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A micro-electro-mechanical system (MEMS) comprising:
a first electrode interposed between a first fixed end and a second fixed end, the first electrode being movable by an actuator element;
a substrate on which the first and second fixed ends are located; and
a second electrode formed on the substrate to face the first electrode,
wherein a shape from the first electrode to the first fixed end and a shape from the first electrode to the second fixed end are asymmetrical, the first electrode configured to be lowered to the second electrode.

2. The MEMS according to claim 1, wherein the actuator element includes first and second actuators, one end of the first actuator is connected to the first fixed end, one end of the second actuator is connected to the second fixed end, and the first electrode is interposed between the first and second actuators, and further, the first electrode is movable by the first and second actuators, a shape from the first electrode to the first fixed end via the first actuator and a shape from the first electrode to the second fixed end via the second actuator being asymmetrical.

3. The MEMS according to claim 2, further comprising:
a spring structure member interposed between the first electrode and the second actuator.

4. The MEMS according to claim 3, wherein a spring constant from the first electrode to the first fixed end differs from a spring constant from the first electrode to the second fixed end.

5. The MEMS according to claim 2, wherein the first and second actuators each include at least any of an electrostatic type actuator, a piezoelectric type actuator, an electromagnetic type actuator, a thermal type actuator, or a hybrid type actuator combining some of these actuators.

6. The MEMS according to claim 5, wherein the piezoelectric type actuator includes a piezoelectric film, and a top electrode and a bottom electrode sandwiching the piezoelectric film.

7. The MEMS according to claim 5, wherein the electrostatic type actuator includes a top electrode arranged above the substrate via an insulating film to face a bottom electrode formed on the substrate, the first and second fixed ends being located on the substrate.

8. The MEMS according to claim 1, further comprising:
an insulating film arranged between the first and second electrodes, wherein the first electrode, the insulating film and the second electrode form a variable capacitor.

9. A micro-electro-mechanical system (MEMS) comprising:
a first fixed end formed on a substrate;
a second fixed end formed on the substrate separated from the first fixed end;
a first actuator whose one end is connected to the first fixed end;
a second actuator whose one end is connected to the second fixed end;
a first electrode arranged between the other end of the first actuator and the other end of the second actuator; and
a spring structure member arranged at one of (i) a position between the first fixed end and the first electrode and (ii) a position between the second fixed end and the first electrode,
wherein a spring constant from the first electrode to the first fixed end differs from a spring constant from the first electrode to the second fixed end.

10. The MEMS according to claim 9, further comprising:
a second electrode arranged to face the first electrode; and
an insulating film arranged between the first and second electrodes, wherein the first electrode, the insulating film and the second electrode form a variable capacitor.

11. The MEMS according to claim 9, wherein the first and second actuators each include at least any of an electrostatic type actuator, a piezoelectric type actuator, an electromagnetic type actuator, a thermal type actuator, or a hybrid type actuator combining some of these actuators.

12. The MEMS according to claim 11, wherein the piezoelectric type actuator includes a piezoelectric film, and a top electrode and a bottom electrode sandwiching the piezoelectric film.

13. The MEMS according to claim 11, wherein the electrostatic type actuator includes a top electrode arranged above the substrate via an insulating film to face a bottom electrode formed on the substrate.

14. The MEMS according to claim 9, further comprising:
a second electrode formed on the substrate to face the first electrode, the first electrode configured to be lowered to the second electrode.

15. A micro-electro-mechanical system (MEMS) comprising:
a first fixed end formed on a substrate;
a second fixed end formed on the substrate separated from the first fixed end;
a beam having one end fixed to the first fixed end and the other end fixed to the second fixed end so that a cavity is formed between the beam and the substrate;
a first electrode formed on a surface of the beam facing the substrate;
a first actuator arranged in the beam between the first fixed end and the first electrode;
a second actuator arranged in the beam between the second fixed end and the first electrode; and
a spring structure member arranged in the beam between the first electrode and the second actuator,
wherein the beam is set so that a spring constant between the first actuator and the first electrode differs from a spring constant between the second actuator and the first electrode.

16. The MEMS according to claim 15, further comprising:
a second electrode arranged to face the first electrode; and
an insulating film arranged between the first and second electrodes, wherein the first electrode, the insulating film and the second electrode form a variable capacitor.

17. The MEMS according to claim 15, wherein the first and second actuators each include at least any of an electrostatic type actuator, a piezoelectric type actuator, an electromagnetic type actuator, a thermal type actuator, or a hybrid type actuator combining some of these actuators.

18. The MEMS according to claim 17, wherein the piezoelectric type actuator includes a piezoelectric film, and a top electrode and a bottom electrode sandwiching the piezoelectric film.

19. The MEMS according to claim 17, wherein the electrostatic type actuator includes a top electrode arranged above the substrate via an insulating film to face a bottom electrode formed on the substrate.

* * * * *